United States Patent
Togami et al.

(10) Patent No.: US 8,459,881 B2
(45) Date of Patent: Jun. 11, 2013

(54) ELECTROMAGNETIC RADIATION CONTAINMENT IN AN OPTOELECTRONIC MODULE

(75) Inventors: Chris K. Togami, San Jose, CA (US);
Gary D. Sasser, San Jose, CA (US);
Frank Flens, Campbell, CA (US)

(73) Assignee: Finisar Corporation, Sunnyvale, CA (US)

( * ) Notice: Subject to any disclaimer, the term of this patent is extended or adjusted under 35 U.S.C. 154(b) by 660 days.

(21) Appl. No.: 12/629,650

(22) Filed: Dec. 2, 2009

(65) Prior Publication Data
US 2010/0296817 A1  Nov. 25, 2010

Related U.S. Application Data

(63) Continuation-in-part of application No. 12/468,790, filed on May 19, 2009, now Pat. No. 8,057,109.

(60) Provisional application No. 61/257,776, filed on Nov. 3, 2009, provisional application No. 61/262,049, filed on Nov. 17, 2009, provisional application No. 61/128,337, filed on May 20, 2008.

(51) Int. Cl.
*G02B 6/36* (2006.01)
*H05K 1/14* (2006.01)

(52) U.S. Cl.
USPC .............................. 385/92; 361/804; 385/139

(58) Field of Classification Search
None
See application file for complete search history.

(56) References Cited

U.S. PATENT DOCUMENTS

| | | | |
|---|---|---|---|
| 4,636,018 A | 1/1987 | Stillie | |
| 5,214,730 A | 5/1993 | Nagasawa et al. | |
| 5,619,604 A | 4/1997 | Shiflett et al. | |
| 5,743,785 A | 4/1998 | Lundberg et al. | |
| 6,085,003 A | 7/2000 | Knight | |
| 6,533,603 B1 | 3/2003 | Togami | |
| 6,848,836 B2 | 2/2005 | Ueda et al. | |
| 6,886,988 B2 | 5/2005 | Brown et al. | |

(Continued)

FOREIGN PATENT DOCUMENTS

| | | |
|---|---|---|
| EP | 0439939 | 9/1995 |
| JP | 09-171127 | 6/1997 |
| WO | 2009143293 | 11/2009 |

OTHER PUBLICATIONS

Supplementary European Search Report completed Aug. 24, 2011 in connection with corresponding European Patent Application No. 09 75 1521 (5 pgs).

(Continued)

*Primary Examiner* — Tina Wong
(74) *Attorney, Agent, or Firm* — Maschoff Brennan

(57) ABSTRACT

Electromagnetic radiation (EMR) containment assemblies for use in optoelectronic modules. In one example embodiment, an EMR containment assembly includes an EMR shield and a mounting spring plate attached to the EMR shield. The EMR shield includes a first substantially flat body defining at least one edge, a plurality of optical ports defined in the first body; and a plurality of fingers defined along at least one edge of the first body. The fingers are configured to bias against a housing of an optoelectronic module. The mounting spring plate includes a second substantially flat body defining at least one edge, an optical window defined in the second body, and a plurality of leaf springs defined along at least one edge of the second body. The leaf springs are configured to bias against an alignment guide positioned within the optoelectronic module.

19 Claims, 7 Drawing Sheets

U.S. PATENT DOCUMENTS

| | | |
|---|---|---|
| 7,118,281 B2 | 10/2006 | Chiu et al. |
| 7,156,562 B2 | 1/2007 | Mazotti et al. |
| 7,217,043 B2 | 5/2007 | Schunk |
| 7,309,173 B2 | 12/2007 | Epitaux et al. |
| 7,731,432 B2 | 6/2010 | Theodoras et al. |
| 7,766,672 B1 | 8/2010 | Chiang |
| 7,841,779 B1 | 11/2010 | Bianchini et al. |
| 8,057,109 B2 | 11/2011 | Flens et al. |
| 8,113,723 B2 | 2/2012 | Togami et al. |
| 2002/0115342 A1 | 8/2002 | Stricot et al. |
| 2003/0048996 A1 | 3/2003 | Lowe et al. |
| 2004/0120660 A1 | 6/2004 | Go et al. |
| 2005/0208822 A1 | 9/2005 | Ishigami et al. |
| 2005/0254821 A1 | 11/2005 | Theodoras |
| 2005/0259994 A1 | 11/2005 | Zhano et al. |
| 2005/0265650 A1 | 12/2005 | Priyadarshi et al. |
| 2006/0262026 A1 | 11/2006 | Gainey et al. |
| 2007/0058911 A1* | 3/2007 | Yu et al. ......................... 385/92 |
| 2008/0226239 A1 | 9/2008 | Oki et al. |
| 2009/0253292 A1 | 10/2009 | Wu |
| 2009/0290619 A1 | 11/2009 | Flens et al. |
| 2010/0080518 A1 | 4/2010 | Teo et al. |
| 2011/0080008 A1 | 4/2011 | Teo et al. |
| 2011/0081119 A1 | 4/2011 | Togami et al. |
| 2012/0148198 A1 | 6/2012 | Togami et al. |

OTHER PUBLICATIONS

U.S. Appl. No. 12/468,790, Feb. 3, 2011, Office Action.
U.S. Appl. No. 12/468,790, Jun. 29, 2011, Notice of Allowance.
U.S. Appl. No. 12/629,673, Oct. 5, 2011, Office Action.
U.S. Appl. No. 12/685,916, Oct. 7, 2011, Notice of Allowance.
Chris Togami et al., Communications Module Integrated Boot and Release Slide, U.S. Appl. No. 12/685,916, filed Jan. 12, 2010.
Chris Togami et al., Simplified and Shortened Parallel Cable, U.S. Appl. No. 12/717,352, filed Mar. 4, 2010.
Tat Ming Teo et al., Latching Mechanism for a Module, U.S. Appl. No. 12/573,637, filed Oct. 5, 2009.
The International Search Report and the Written Opinion of the International Searching Authority, International Application No. PCT/US2009/044740, date of mailing Jun. 7, 2010.
U.S. Appl. No. 12/629,673, May 14, 2012, Office Action.
U.S. Appl. No. 12/629,673, Jul. 30, 2012, Notice of Allowance.
U.S. Appl. No. 12/573,637, May 25, 2012, Restriction Requirement.
U.S. Appl. No. 12/573,637, Aug. 10, 2012, Office Action.

* cited by examiner

ELECTROMAGNETIC RADIATION CONTAINMENT IN AN OPTOELECTRONIC MODULE

CROSS-REFERENCE TO A RELATED APPLICATION

This application claims the benefit of U.S. Provisional Patent Application Ser. No. 61/257,776, filed on Nov. 3, 2009, and U.S. Provisional Patent Application Ser. No. 61/262,049, filed on Nov. 17, 2009, each of which is incorporated herein by reference in its entirety. This application is also a continuation-in-part of U.S. patent application Ser. No. 12/468,790, filed on May 19, 2009, which claims the benefit of U.S. Provisional Patent Application Ser. No. 61/128,337, filed on May 20, 2008, each of which is incorporated herein by reference in its entirety.

BACKGROUND

Optoelectronic modules, such as optoelectronic transceiver or transponder modules, are increasingly used in electronic and optoelectronic communication. Optoelectronic modules generally include one or more printed circuit boards having electronic circuitry. The electronic circuitry of a printed circuit board can create electromagnetic radiation (EMR). When EMR inadvertently escapes from an optoelectronic module, the EMR can cause electromagnetic interference (EMI) in nearby electronic devices which can degrade the functionality of those electronic devices. Therefore, it is important to control the inadvertent escape of EMR from optoelectronic modules. In addition, as host devices are configured to simultaneously interface with increasing numbers of optoelectronic modules, and as data rates of optoelectronic modules increase, the inadvertent escape of EMR becomes increasingly problematic.

Another related problem is the electromagnetic susceptibility (EMS) of optoelectronic modules. The EMS of an optoelectronic module is the degree to which the optoelectronic module is subject to malfunction or failure under the influence of electromagnetic radiation. Therefore, it is also important to control the inadvertent introduction of EMR into optoelectronic modules.

Controlling the escape/introduction of EMR from/into an optoelectronic module is generally accomplished by surrounding the optoelectronic module, as much as possible, with a housing formed from an electrically conductive material, which limits the escape/introduction of EMR, thus decreasing EMI in nearby electronic devices and in the optoelectronic module. It can be difficult, however, to control the transmission of EMR through required openings in the housing of an optoelectronic module, such as the optical ports that are configured to receive optical fiber connectors. In addition, where portions of the housing are formed from plastic, it can be particularly difficult to contain EMR.

In addition, aligning optical transmitters and optical receivers in an optoelectronic module with an optical cable connector can be difficult. In particular, achieving optical alignment despite mechanical tolerances can be particularly difficult when a cable connector is permanently attached to an optoelectronic module without the use of adhesives.

Further, dealing with heat generated within an optoelectronic module can be complicated. In particular, transmitters and receivers within the optoelectronic module generate heat during operation, and this heat must be dissipated in order to avoid the overheating, and consequent damage, of various components of the optoelectronic module.

BRIEF SUMMARY OF SOME EXAMPLE EMBODIMENTS

In general, example embodiments of the invention relate to electromagnetic radiation (EMR) containment assemblies for use in optoelectronic modules. The example EMR containment assemblies disclosed herein are effective at limiting the transmission of EMR out of and/or into optoelectronic modules into which the EMR containment assemblies are integrated. In addition, the EMR containment assemblies disclosed herein can help compensate for manufacturing tolerances in an optoelectronic module in order to properly apply compressive forces to an optical assembly and ensure good thermal contact to a fixed contact surface in a housing for efficient transfer of thermal energy out of the optoelectronic module.

In one example embodiment, an EMR containment assembly includes an EMR shield and a mounting spring plate attached to the EMR shield. The EMR shield includes a first substantially flat body defining at least one edge, a plurality of optical ports defined in the first body; and a plurality of fingers defined along at least one edge of the first body. The fingers are configured to bias against a housing of an optoelectronic module. The mounting spring plate includes a second substantially flat body defining at least one edge, an optical window defined in the second body, and a plurality of leaf springs defined along at least one edge of the second body. The leaf springs are configured to bias against an alignment guide positioned within the optoelectronic module.

In another example embodiment, an optoelectronic module includes a housing including a top shell and a bottom shell, a printed circuit board (PCB) at least partially enclosed within the housing, a lens block enclosed within the housing, an alignment guide aligned with the lens block, and an EMR containment assembly positioned between the lens block and the alignment guide. The EMR containment assembly includes EMR shield and a mounting spring plate attached to the EMR shield. The EMR shield includes a first substantially flat body defining at least one edge, a plurality of optical ports defined in the first body, and a plurality of fingers defined along at least one edge of the first body. Each finger is biased against the top shell or the bottom shell. The mounting spring plate includes a second substantially flat body defining at least one edge and a plurality of leaf springs defined along at least one edge of the second body. Each leaf spring is biased against the alignment guide.

In yet another example embodiment, an active cable includes a communications cable comprising one or more optical fibers. The communications cable has first and second ends. The active cable also includes first and second optoelectronic modules attached to the first and second ends of the communications cable, respectively. Each optoelectronic module includes a housing comprising a top shell and a bottom shell, a PCB at least partially enclosed within the housing, transmitter and receiver arrays in electrical communication with the PCB, and alignment guide, and an EMR containment assembly positioned between the transmitter and receiver arrays and the alignment guide. A portion of each of the optical fibers is positioned within the alignment guide and is mechanically aligned with the transmitter and receiver arrays. The EMR containment assembly includes an EMR shield and a mounting spring plate attached to the EMR shield. The EMR shield includes a first body defining at least one edge, a plurality of optical ports defined in the first body, and a plurality of fingers defined along at least one edge of the first body. Each finger being biased against the top shell or the bottom shell. The mounting spring plate includes a second body defining at least one edge and a plurality of leaf springs defined along at least one edge of the second body. Each leaf spring being biased against the alignment guide.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION OF SOME EXAMPLE EMBODIMENTS

Example embodiments of the present invention relate to electromagnetic radiation (EMR) containment assemblies for use in optoelectronic modules, such as optoelectronic modules that are substantially compliant with the QSFP MSA and the CXP MSA. The example EMR containment assemblies disclosed herein are effective at limiting the transmission of EMR out of and/or into optoelectronic modules into which the EMR containment assemblies are integrated. In addition, the EMR containment assemblies disclosed herein can help compensate for manufacturing tolerances in an optoelectronic module in order to properly apply compressive forces to an optical assembly and ensure good thermal contact to a fixed contact surface in a housing for efficient transfer of thermal energy out of the optoelectronic module.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

1. Example Optoelectronic Module

Figure 1A:
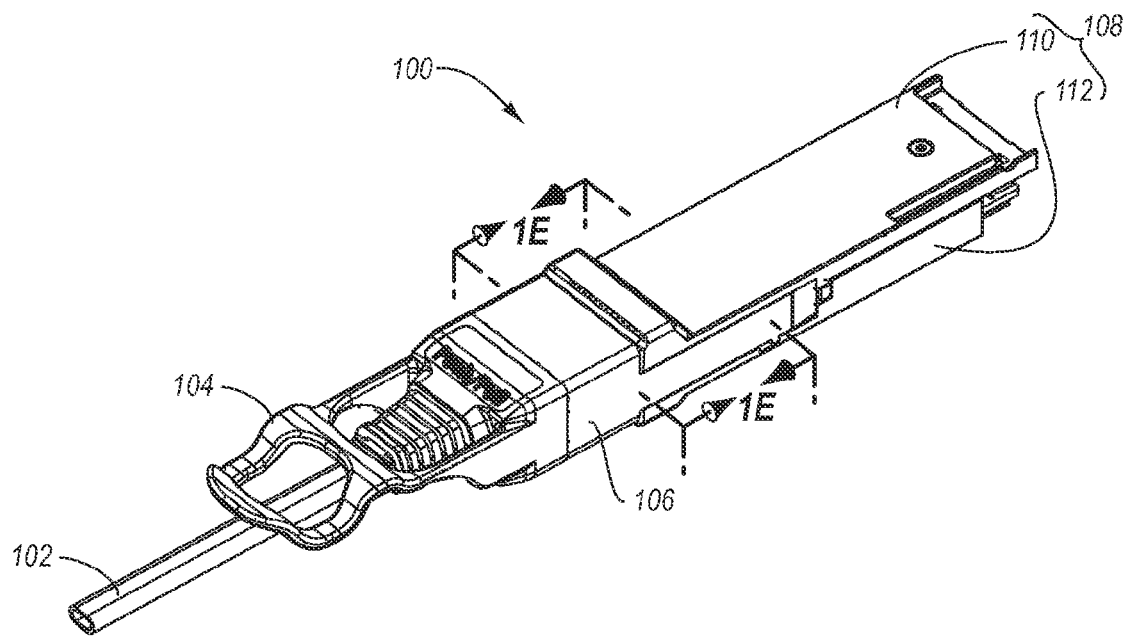
FIG. 1A is a top front perspective view of an example optoelectronic module and an attached ribbon cable.
Figure 1B:
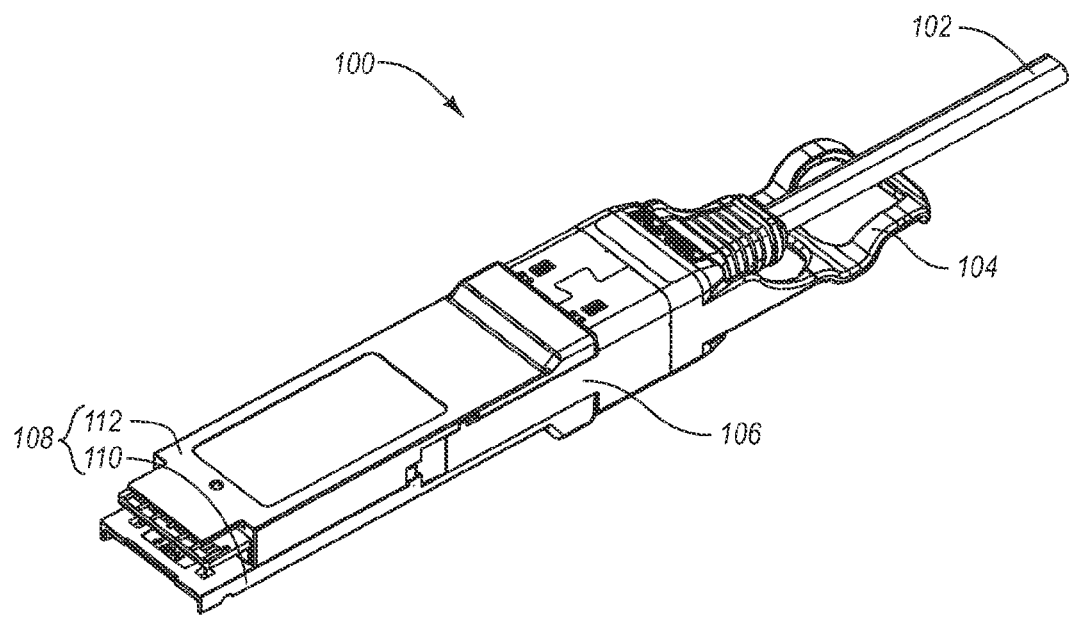
FIG. 1B is a bottom rear perspective view of the example optoelectronic module and attached ribbon cable of FIG. 1A.

Reference is first made to FIGS. 1A and 1B, which are top and bottom perspective views of an example optoelectronic module 100 for use in transmitting and receiving optical signals in connection with one or more other devices on a network, and communicating via electrical signals with a host device. As disclosed in FIGS. 1A and 1B, the optoelectronic module 100 is permanently attached to a communications cable 102, and thus the optoelectronic module 100 represents one end of an "active cable" which includes another optoelectronic module (not shown) permanently attached to the other end of the communications cable 102.

It is understood, however, that the communications cable 102 could instead be releasably connected to the optoelectronic module 100, in which case the optoelectronic module 100 would function as a stand-alone module. For example, where the communications cable 102 is a fiber-optic ribbon cable, the communications cable 102 can be terminated on one or both ends with a multi-fiber push on (MPO) male connector and the optoelectronic module 100 can include a corresponding MPO female connector configured to pluggably receive the MPO male connector.

The ribbon cable 102 is a multichannel fiber-optic communications cable that includes twelve (12) fibers, four (4) of which are employed to transfer data signals in one direction, four (4) of which are employed to transfer data signals in the opposite direction, and four (4) of which are not currently in use but are available for future use.

The optoelectronic module 100 can be configured for optical signal transmission and reception at a variety of per-second data rates including, but not limited to, 40 Gbit or higher. Further, the optoelectronic module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, 1610 nm, or longer wavelengths. Also, the optoelectronic module 100 can be configured to support various communication protocols including, but not limited to, INFINIBAND, Fast Ethernet, Gigabit Ethernet, 10 Gigabit Ethernet, 1×, 2×, 4×, 8×, and 10×Fibre Channel, and SONET OC-3, OC-12, OC-48, OC-192, and OC-768. Further, the optoelectronic module 100 can be configured to operate at various temperature ranges including, but not limited to, 0° C. to 70° C. and −40° C. to 85° C. In addition, although the example optoelectronic module 100 is configured to be substantially compliant with the QSFP MSA, the optoelectronic module 100 can instead be configured to assume a variety of different form factors that are substantially compliant with various transceiver and/or transponder MSAs including, but not limited to, SFF, SFP, XFP, XPAK, X2, XENPAK, or CXP.

The optoelectronic module 100 includes a handle 104 operably connected to a latch 106 that can be employed to insert the optoelectronic module 100 into a cage of a host device (not shown) and to extract the optoelectronic module 100 from the cage. In some example embodiments, the latch 106 is formed from plastic or other non-shielding material, which causes the latch 106 to be relatively ineffective at shielding EMR exiting or entering the optoelectronic module 100. The optoelectronic module 100 further includes a housing 108 that generally includes a top shell 110 and a bottom shell 112. The top and bottom shells 110 and 112 may be formed from zinc with a copper-nickel coating, for example.

Figure 1C:
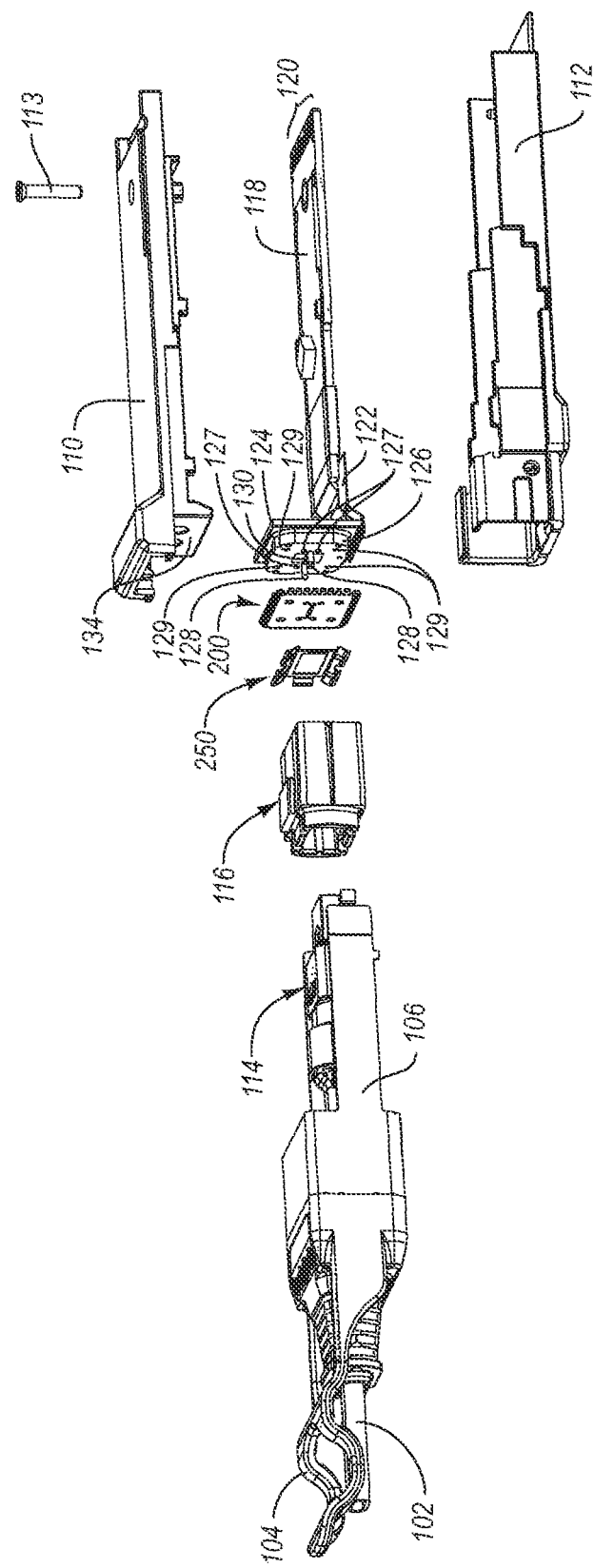
FIG. 1C is an exploded front perspective view of the example optoelectronic module and attached ribbon cable of FIG. 1A showing an example electromagnetic radiation (EMR) plate and an example spring mounting plate.

With reference now to FIG. 1C, additional aspects of the optoelectronic module 100 are disclosed. In particular, FIG. 1C discloses that the top and bottom shells 110 and 112 of the optoelectronic module 100 are configured to be held together with a fastener 113 and partially surround a modified MPO-style male connector 114 attached to the communications cable 102. The modified MPO-style male connector 114 is configured to be permanently received within a modified MPO-style female connector, known as an alignment guide 116. The top and bottom shells 110 and 112 are also generally surround a printed circuit board (PCB) 118 having an exposed edge connector 120, a flexible circuit 122, a conductive mounting plate 124, a lens block 126, alignment pins 128, a transmitter/receiver array 130, an EMR shield 200, and a mounting spring plate 250. The alignment protrusion 127, alignment pins 128, and alignment indentations 129 facilitate the alignment of the alignment guide 116, the mounting spring plate 250, the EMR shield 200, the lens block 126, and the transmitter/receiver array 130. The lens block 126 holds the transmitter/receiver array 130 and defines alignment protrusions 127 and alignment indentations 129. The transmitter/receiver array 130 is physically and electrically connected to the flexible circuit 122, which is in turn physically and electrically connected to the PCB 118.

In operation, incoming optical data signals travel from the fiber-optic communications cable 102, through the modified MPO-style male connector 114, the alignment guide 116, the mounting spring plate 250, the EMR shield 200, the lens block 126, and are received by the receivers of the transmitter/receiver array 130. The receivers of the transmitter/receiver array 130 then convert the incoming optical data signal into electrical data signals. These electrical data signals are then passed along conductive traces (not shown) on the flexible circuit 122 to receiver circuitry (not shown) on the PCB 118. After being refined by the receiver circuitry, these electrical data signals are then passed to the host device (not shown) into which the optoelectronic module 100 is positioned via the edge connector 120.

Similarly, outgoing electrical data signals travel from the host device (not shown) into which the optoelectronic module 100 is positioned into the PCB 118 via the edge connector 120. Transmitter circuitry (not shown) on the PCB 118 refines these electrical data signals before passing them along conductive traces (not shown) on the flexible circuit 122 to the transmitters of the transmitter/receiver array 130. The transmitters of the transmitter/receiver array 130 convert these electrical data signals into optical data signals before transmitting them through the lens block 126, the EMR shield 200, the mounting spring plate 250, the alignment guide 116, and the modified MPO-style male connector 114, and into the fiber-optic communications cable 102. In this manner, the host device (not shown) into which the optoelectronic module 100 is positioned can communicate electronically with a distance host device (not shown).

The transmitters of the transmitter/receiver array 130 may be an array of optical transmitters such as vertical cavity surface emitting lasers (VCSELs), or the like. The receivers of the transmitter/receiver array 130 may be an array of optical receivers such as photodetectors, or the like. For example, the transmitters may be a four (4) channel VCSEL array and the receivers may be a four (4) channel PIN photodetector array. In some embodiments, only transmitters or receivers are includes in the optoelectronic module 100, such that the optoelectronic module 100 becomes only an optical transmitter or receiver, respectively.

With reference now to FIGS. 2A-2D, additional aspects of the EMR shield 200 and the mounting spring plate 250 are disclosed. In particular, as disclosed in FIG. 2A, the EMR shield 200 includes a substantially flat body 202 defining four edges 204-210. A plurality of fingers 214 are defined along all four edges 204-210 of the body 202 and extending radially outward from the body 202 at substantially regular intervals. Although the fingers 214 are defined at substantially regular intervals, it is understood that defining the fingers 214 at irregular intervals can also be effective. Also, optical ports 212, alignment pin openings 216, alignment post openings 218, and alignment protrusion openings 220 are defined in the body 202. Each of the optical ports 212 is sized and positioned such that multiple optical signals can pass through the port. For example, two separate transmitters from the transmitter/receiver array 130 (see FIG. 1C) can transmit two separate optical signals through one of the optical ports 212. Similarly, two separate receivers from the transmitter/receiver array 130 (see FIG. 1C) can receive two separate optical signals through one of the optical ports 212.

Figure 2A:
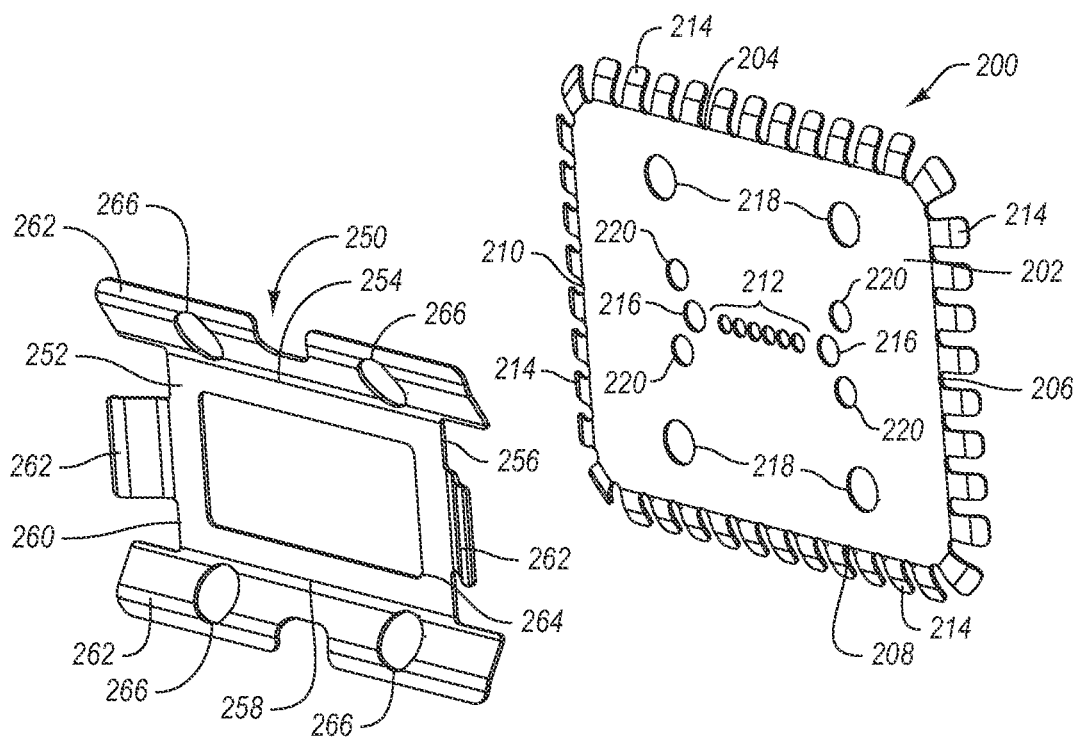
FIG. 2A is a front perspective view of the example EMR shield and spring mounting plate of FIG. 1C.

As disclosed in FIG. 2A, the mounting spring plate 250 includes a substantially flat body 252 defining four edges 254-260. A plurality of leaf springs 262 are defined along all four edges 254-260 of the body 252. Further, an optical window 264 is defined in the body 252 and alignment post openings 266 are defined in the leaf springs 262. The EMR shield 200 and the mounting spring plate 250 can be formed from stamped sheet metal, for example.

Figure 2B:
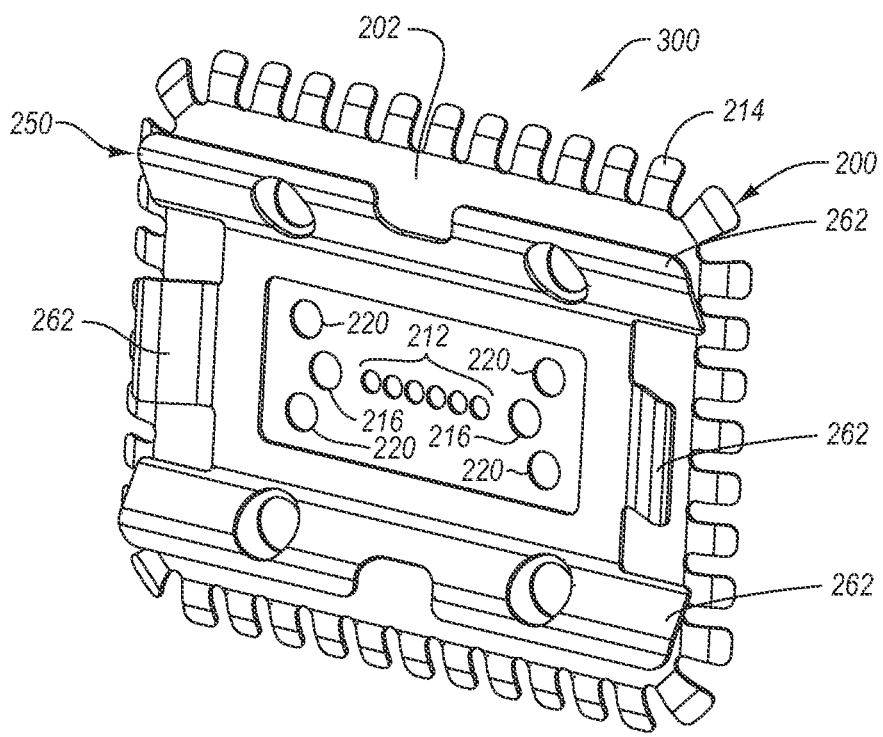
FIG. 2B is a front perspective view of the example EMR shield of FIG. 2A attached to the example spring mounting plate of FIG. 2A forming an EMR containment assembly.
Figure 2C:
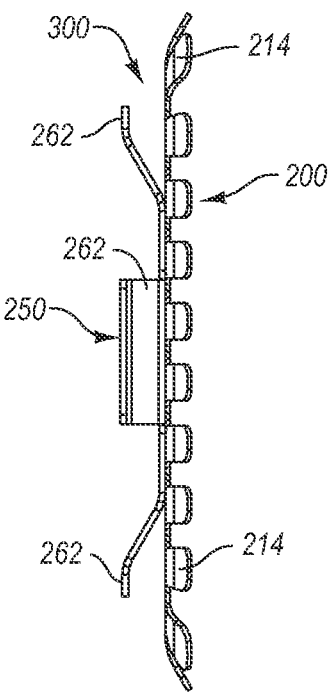
FIG. 2C is a side view of the EMR containment assembly of FIG. 2B.
Figure 2D:
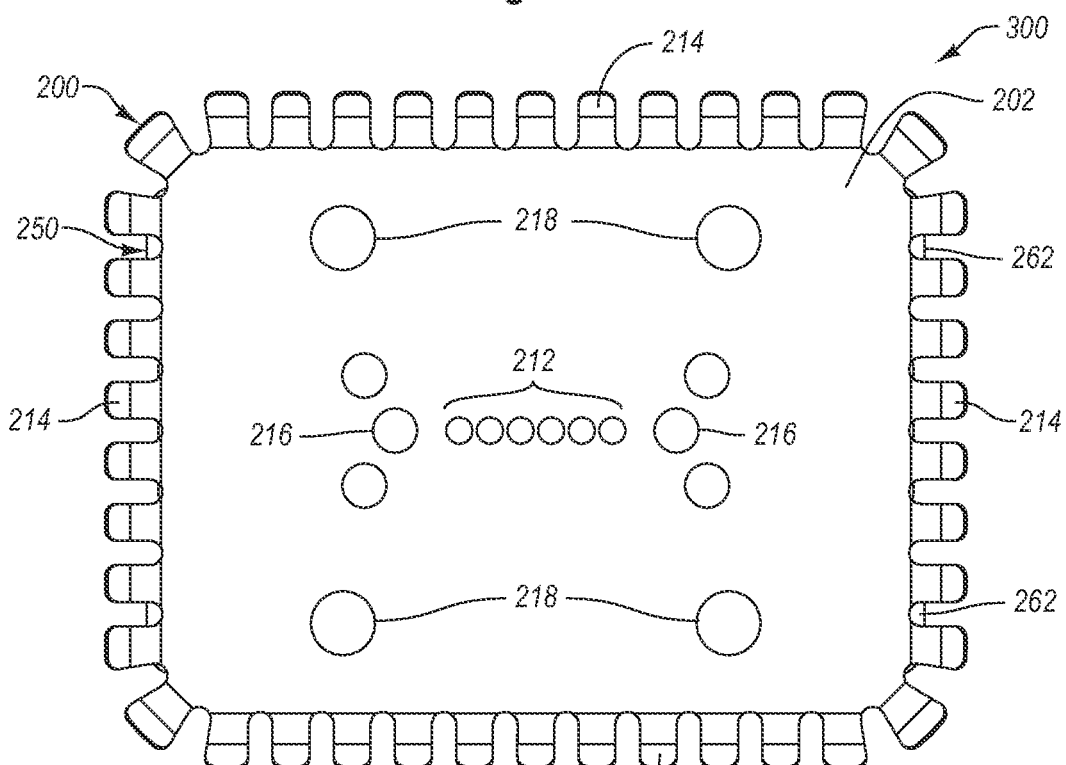
FIG. 2D is a back view of the EMR containment assembly of FIG. 2B.

FIGS. 2B-2D disclose an EMR containment assembly 300 that is formed by attaching the example EMR shield 200, by spot welding for example, to the spring mounting plate 250. The EMR containment assembly 300 can be assembled prior to the positioning of the EMR containment assembly 300 into the optoelectronic module 100.

Figure 1D:
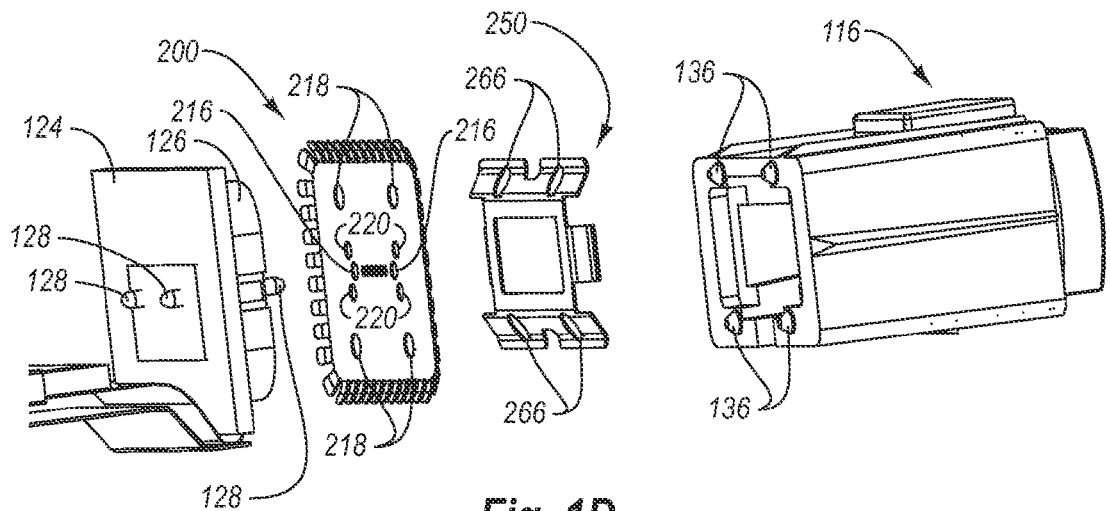
FIG. 1D is an exploded rear perspective view of a portion of the example optoelectronic module of FIG. 1A and the example EMR shield and spring mounting plate of FIG. 1C.

As disclosed in the exploded view of FIG. 1D, the alignment pin openings 216 align with the alignment pins 128. Further, the alignment post openings 266 may align with posts 136 on the alignment guide 116. Also, the alignment protrusions openings 220 align with the alignment protrusions 127 (see FIG. 1C). Thus, the alignment pins 128, alignment posts 136, and the alignment protrusions 127 cooperate to maintain the EMR shield 200 and the mounting spring plate 250 in a proper position within the top and bottom shells 110 and 112.

Figure 1E:
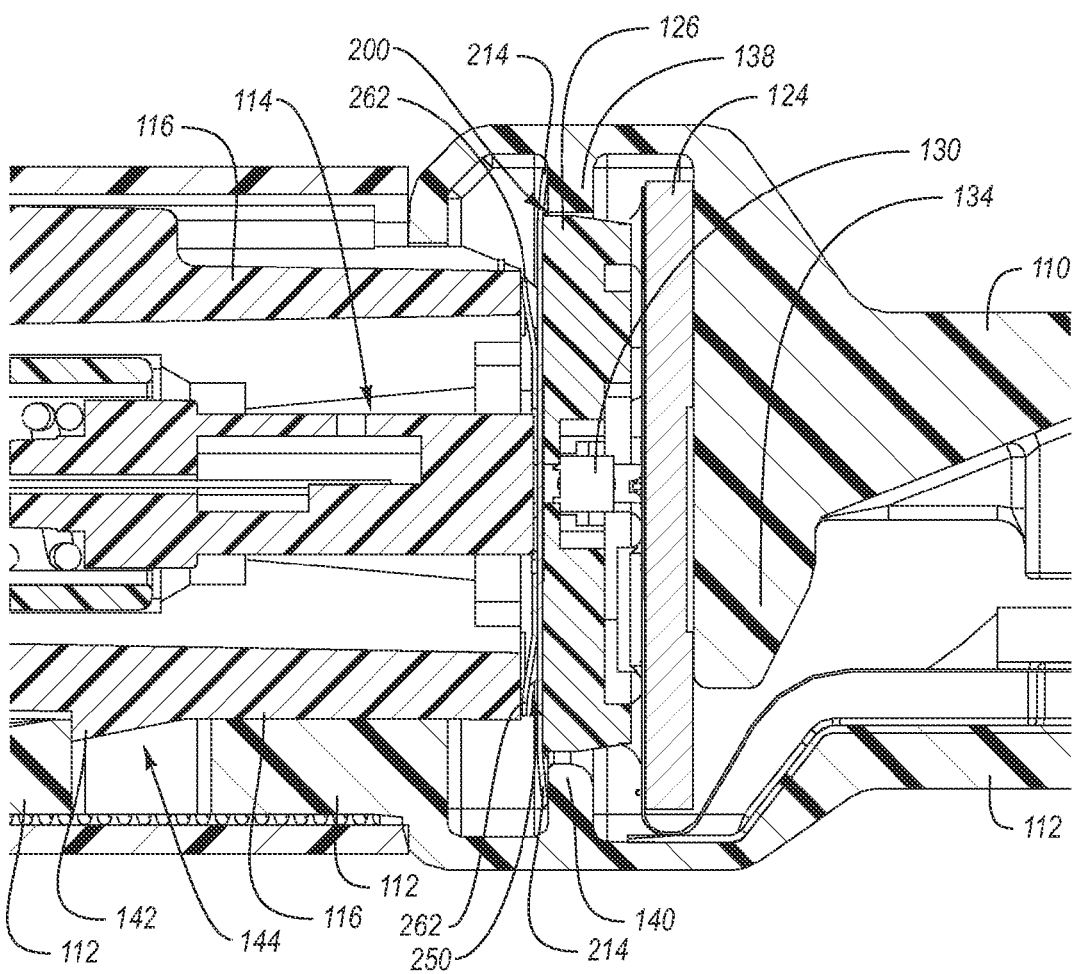
FIG. 1E is a side cross-sectional view of a portion of the example optoelectronic module of FIG. 1A showing the assembled functionality of the example EMR shield and spring mounting plate of FIG. 1C.

As disclosed in the cross-sectional view of FIG. 1E, once the optoelectronic module 100 is assembled, the fingers 214 of the EMR shield 200 bias against an inside rim 138 of the top shell 110 and an inside rim 140 of the bottom shell 112, thus making 360 degrees of contact with the top and bottom shells 110 and 112, thus effectively containing EMR from escaping or entering the optoelectronic module 100 past the EMR shield 200.

Further, once the optoelectronic module 100 is assembled, the leaf springs 262 of the mounting spring plate 250 bias against the alignment guide 116 positioned within the optoelectronic module 100. This biasing of the mounting spring plate 250 against the alignment guide 116 helps to hold the alignment guide 116 in a proper position within the optoelectronic transceiver module 100. In particular, this biasing of the alignment guide 116 by the mounting spring plate 250 is maintained when a protrusion 142 of the alignment guide 116 is firmly in contact with the edge of an opening 144 in the bottom shell 112. This proper positioning of the alignment guide 116 enables the modified MPO-style male connector 114 to properly align with transmitter/receiver array 130 positioned within the lens block 126 in order for optical signals to pass between the modified MPO-style male connector 114 and the transmitter/receiver array 130.

In addition, this biasing of the mounting spring plate 250 against the alignment guide 116 also maintains the conductive mounting plate 124 pressed firmly against the protruding heat spreader 134 that is integrally formed as part of the top shell 110. Thus, heat generated by the transmitters and receivers of the transmitter/receiver array 130 can be efficiently transferred through the conductive mounting plate 124 to the top shell 110 and dissipated into the air or other suitable thermal heat sink device outside the optoelectronic transceiver module 100.

2. Another Example Optoelectronic Module

Figure 3A:
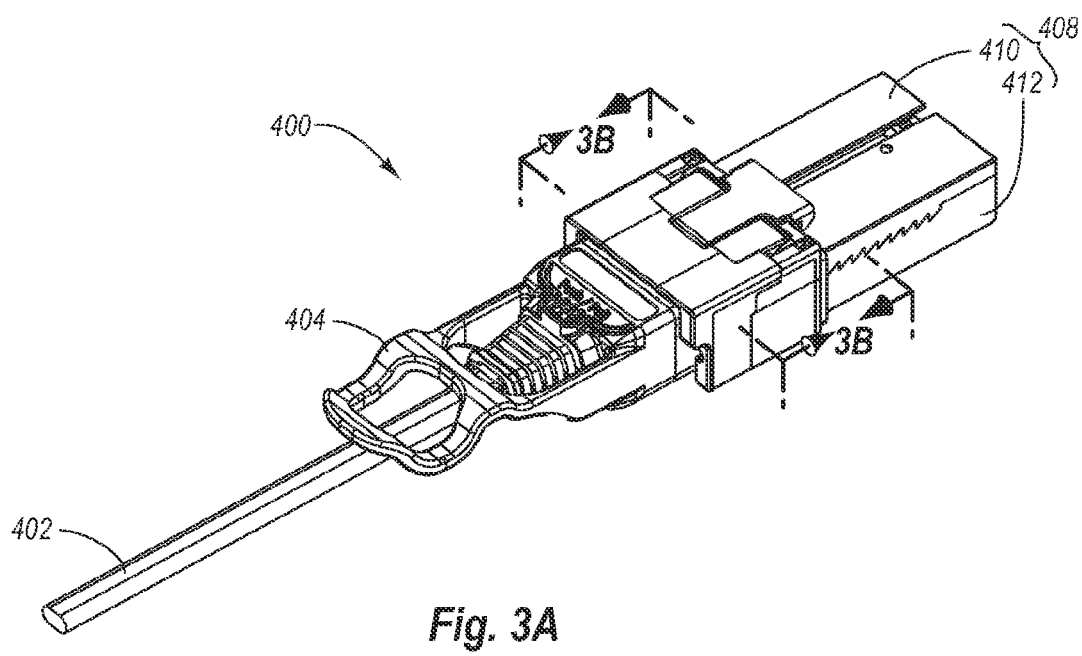
FIG. 3A is a top front perspective view of another example optoelectronic module and an attached ribbon cable.

With reference now to FIG. 3A, another example optoelectronic module 400 is disclosed. As disclosed in FIG. 3A, the optoelectronic module 400 is permanently attached to a communications cable 402, and thus the optoelectronic module 400 represents one end of an "active cable" which includes another optoelectronic module (not shown) permanently attached to the other end of the communications cable 402. It is understood, however, that the optoelectronic module 400 could instead be configured as a stand-alone module.

The ribbon cable 402 is a multichannel fiber-optic communications cable that includes twenty four (24) fibers, with twelve (12) of the fibers being employed to transfer data signals in one direction, and the other twelve (12) fibers being employed to transfer data signals in the opposite direction.

The optoelectronic module 400 can be configured for optical signal transmission and reception at a variety of per-second data rates including, but not limited to, 150 Gbit or higher. Further, the optoelectronic module 400 can be configured for optical signal transmission and reception at various wavelengths, supporting various communication protocols, and operating at various temperature ranges including those listed above in connection with the optoelectronic module 400. In addition, although the example optoelectronic module 400 is configured to be substantially compliant with the CXP MSA, the optoelectronic module 100 can instead be configured to assume a variety of different form factors that are substantially compliant with various transceiver and/or transponder MSAs including, but not limited to, SFF, SFP, XFP, XPAK, X2, XENPAK, or QSFP.

The optoelectronic module 400 includes a handle 404 and a latch 406 that function similarly to the handle 104 and the latch 106 of the optoelectronic module 100. The optoelectronic module 400 further includes a housing 408 that generally includes a top shell 410 and a bottom shell 412 that can be formed from similar materials as the top and bottom shells 110 and 112, for example.

Figure 3B:
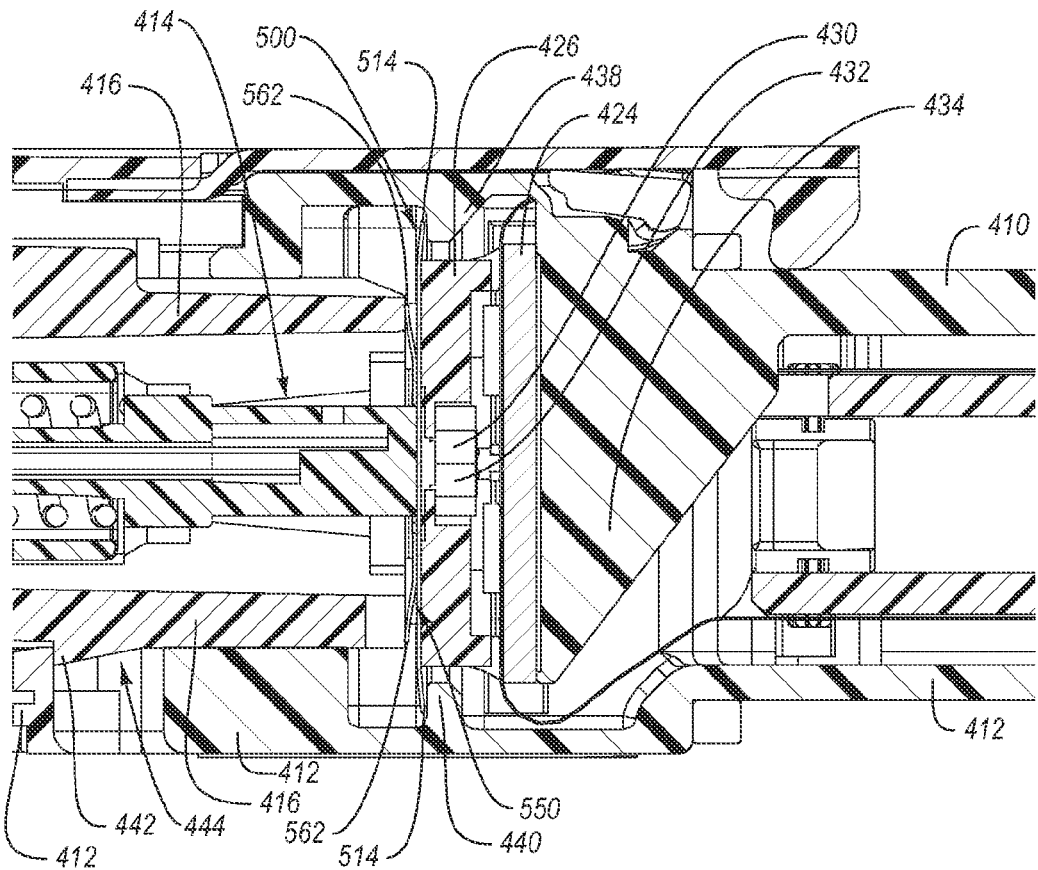
FIG. 3B is a side cross-sectional view of a portion of the example optoelectronic module of FIG. 3A showing the assembled functionality of another example EMR shield and spring mounting plate.

With reference now to FIG. 3B, additional aspects of the optoelectronic module 400 are disclosed. In particular, FIG. 3B discloses that the top and bottom shells 410 and 412 of the optoelectronic module 400 are configured to partially surround a modified MPO-style male connector 414 attached to the communications cable 402. The modified MPO-style male connector 414 is permanently received within a modified MPO-style female alignment guide 416. The top and bottom shells 410 and 412 also generally surround a printed circuit board (PCB) 418, a flexible circuit 422, a conductive mounting plate 424, a lens block 426, a receiver array 430, a transmitter array 432, an EMR shield 500, and a mounting spring plate 550. The lens block 426 holds the receiver and transmitter arrays 430 and 432, which collectively function similarly in form and function to the transmitter/receiver array 130 discussed above.

Figure 4A:
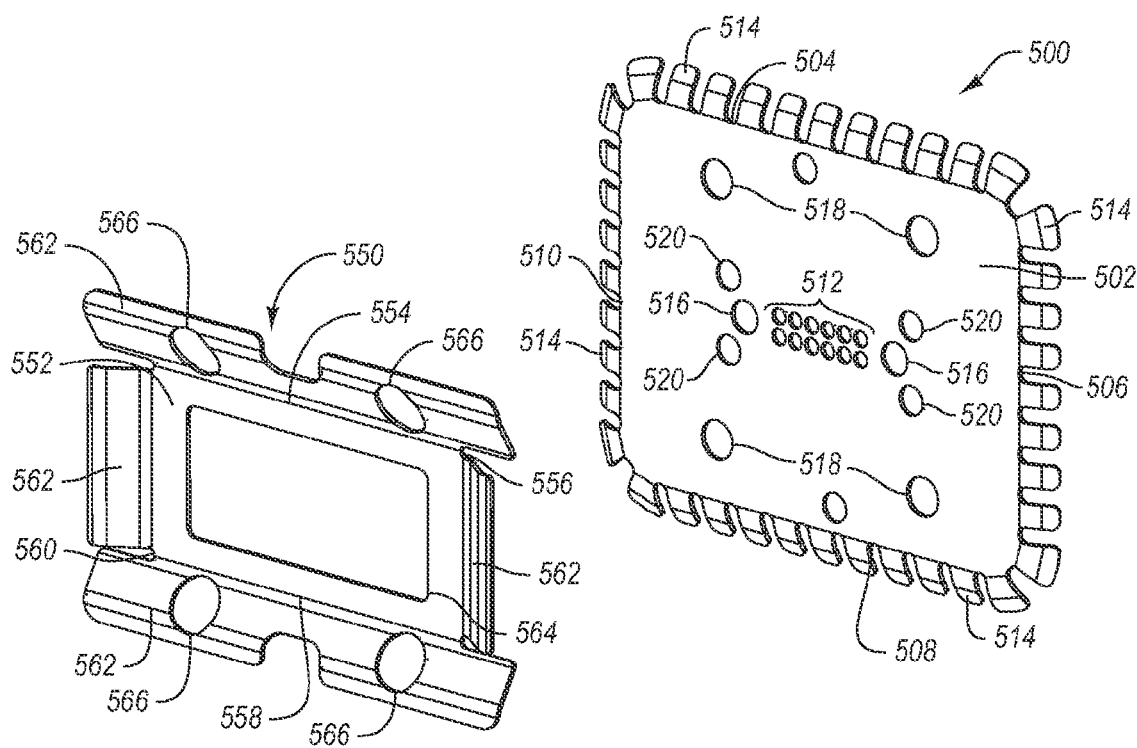
FIG. 4A is a front perspective view of the example EMR shield and spring mounting plate of FIG. 3B.

With reference now to FIG. 4A, additional aspects of the EMR shield 500 and the mounting spring plate 550 are disclosed. In particular, as disclosed in FIG. 4A, the EMR shield 500 includes a substantially flat body 502 defining four edges 504-510. A plurality of fingers 514 are defined along all four edges 504-510 of the body 502. Also, optical ports 512, alignment pin openings 516, alignment post openings 518, and alignment protrusion openings 520 are defined in the body 502. Similarly, the mounting spring plate 550 includes a substantially flat body 552 defining four edges 554-560. A plurality of leaf springs 562 are defined along all four edges 554-560 of the body 552. Further, an optical window 564 is defined in the body 552 and alignment post openings 566 are defined in the leaf springs 562. The EMR shield 500 and the mounting spring plate 550 can be formed from stamped sheet metal, for example.

Figure 4B:
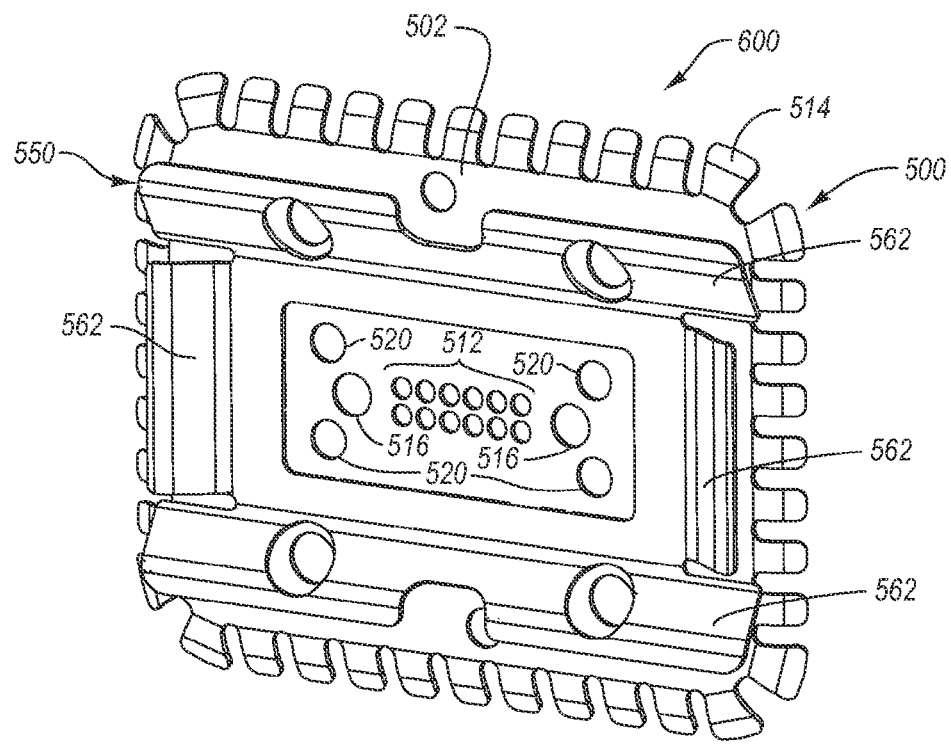
FIG. 4B is a front perspective view of the example EMR shield of FIG. 4A attached to the example spring mounting plate of FIG. 4A forming an EMR containment assembly.

FIG. 4B discloses an EMR containment assembly 600 that is formed by attaching the example EMR shield 500, by spot welding for example, to the spring mounting plate 550. The EMR containment assembly 300 can be assembled prior to the positioning of the EMR containment assembly 600 into the optoelectronic module 400.

As disclosed in the cross-sectional view of FIG. 3B, once the optoelectronic module 400 is assembled, the fingers 514 of the EMR shield 500 bias against an inside rim 438 of the top shell 410 and an inside rim 440 of the bottom shell 412, thus making 360 degrees of contact with the top and bottom shells 410 and 412, thus effectively containing EMR from escaping or entering the optoelectronic module 400 past the EMR shield 500.

Further, once the optoelectronic module 400 is assembled, the leaf springs 562 of the mounting spring plate 550 bias against the alignment guide 416 positioned within the optoelectronic module 400. This biasing of the mounting spring plate 550 against the alignment guide 416 helps to hold the alignment guide 416 in a proper position within the optoelectronic transceiver module 400. In particular, this biasing of the alignment guide 416 by the mounting spring plate 550 is maintained when a protrusion 442 of the alignment guide 416 is firmly in contact with the edge of an opening 444 in the bottom shell 412. This proper positioning of the alignment guide 416 enables the modified MPO-style male connector 414 to properly align with the receiver array 430 and the transmitter array 432 positioned within the lens block 426 in order for optical signals to pass between the modified MPO-style male connector 414 and the receiver and transmitter arrays 430 and 432.

In addition, this biasing of the mounting spring plate 550 against the alignment guide 416 also maintains the conductive mounting plate 424 pressed firmly against the protruding heat spreader 434 that is integrally formed as part of the top shell 410. Thus, heat generated by the receivers of the receiver array 430 and the transmitters of the transmitter array 432 can be efficiently transferred through the conductive mounting plate 424 to the top shell 410 and dissipated into the air or other suitable thermal heat sink device outside the optoelectronic transceiver module 400.

The example embodiments disclosed herein may be embodied in other specific forms. The example embodiments disclosed herein are to be considered in all respects only as illustrative and not restrictive.

What is claimed is:

1. An electromagnetic radiation (EMR) containment assembly comprising:
   an EMR shield comprising:
      a first substantially flat body defining at least one edge;
      a plurality of optical ports defined in the first body; and
      a plurality of fingers defined along and extending from at least one edge of the first body, the fingers configured to bias against a housing of an optoelectronic module in a first direction; and
   a mounting spring plate attached to the EMR shield, the mounting spring plate comprising:
      a second substantially flat body defining at least one edge;
      an optical window defined in the second body; and
      a plurality of leaf springs defined along and extending from at least one edge of the second body, the leaf springs configured to bias against an alignment guide positioned within the optoelectronic module in a second direction that is perpendicular to the first direction.

2. The EMR containment assembly as recited in claim 1, wherein the EMR containment assembly comprises stamped sheet metal and the EMR shield is spot welded to the mounting spring plate.

3. The EMR containment assembly as recited in claim 1, wherein the plurality of finger extend radially outward from the first body at substantially regular intervals.

4. The EMR containment assembly as recited in claim 1, wherein the EMR shield further comprises:
   one or more alignment pin openings defined in the first substantially flat body; and
   one or more alignment post openings defined in the first substantially flat body.

5. The EMR containment assembly as recited in claim 4, wherein the mounting spring plate further comprises:
   one or more alignment post openings defined in the leaf springs.

6. An optoelectronic module comprising:
   a housing comprising a top shell and a bottom shell;
   a printed circuit board (PCB) at least partially enclosed within the housing;
   a lens block enclosed within the housing;
   an alignment guide aligned with the lens block; and
   an EMR containment assembly positioned between the lens block and the alignment guide, the EMR containment assembly comprising:
      an EMR shield comprising:
         a first substantially flat body defining at least one edge;
         a plurality of optical ports defined in the first body; and
         a plurality of fingers defined along at least one edge of the first body, each finger being biased against the top shell or the bottom shell; and
      a mounting spring plate attached to the EMR shield, the mounting spring plate comprising:
         a second substantially flat body defining at least one edge; and
         a plurality of leaf springs defined along at least one edge of the second body, each leaf spring being biased against the alignment guide.

7. The optoelectronic module as recited in claim 6, wherein the lens block holds a transmitter array and a receiver array, and wherein the transmitters are configured to transmit multiple optical signals through at least one of the optical ports and the receivers are configured to receive multiple optical signals through at least one of the optical ports.

8. The optoelectronic module as recited in claim 7, further comprising a conductive mounting plate positioned proximate the transmitter and receiver arrays and proximate a protruding heat spreader of the top shell, wherein the biasing of the leaf causes the conductive mounting plate to be pressed firmly against the protruding heat spreader.

9. The optoelectronic module as recited in claim 6, wherein the EMR containment assembly comprises stamped sheet metal and the EMR shield is spot welded to the mounting spring plate.

10. The optoelectronic module as recited in claim 6, wherein each finger is biased against an inside rim of the top shell or an inside rim of the bottom shell.

11. The optoelectronic module as recited in claim 6, wherein the EMR shield is attached to the lens block via one or more alignment pins.

12. The optoelectronic module as recited in claim 6, wherein the optoelectronic module is substantially compliant with the QSFP MSA or the CXP MSA.

13. The optoelectronic module as recited in claim 6, wherein:
   the plurality of fingers extend from the at least one edge of the first body;
   the plurality of fingers bias against the top shell or the bottom shell in a first direction;
   the plurality of leaf springs extend from the at least one edge of the second body; and
   the plurality of leaf springs bias against the alignment guide in a second direction that is perpendicular to the first direction.

14. An active cable comprising:
   a communications cable comprising one or more optical fibers, the communications cable having first and second ends; and
   first and second optoelectronic modules attached to the first and second ends of the communications cable, respectively, each optoelectronic module comprising:
      a housing comprising a top shell and a bottom shell;
      a PCB at least partially enclosed within the housing;
      transmitter and receiver arrays in electrical communication with the PCB;
      an alignment guide, a portion of each of the optical fibers positioned within the alignment guide and mechanically aligned with the transmitter or receiver arrays; and
      an EMR containment assembly positioned between the transmitter and receiver arrays and the alignment guide, the EMR containment assembly comprising:
         an EMR shield comprising:
            a first body defining at least one edge;

a plurality of optical ports defined in the first body; and a plurality of fingers defined along at least one edge of the first body, each finger being biased against the top shell or the bottom shell; and a mounting spring plate attached to the EMR shield, the mounting spring plate comprising:

a second body defining at least one edge; and a plurality of leaf springs defined along at least one edge of the second body, each leaf spring being biased against the alignment guide.

15. The active cable as recited in claim 14, wherein the alignment guide includes a protrusion that is firmly in contact with an edge of an opening in the bottom shell.

16. The active cable as recited in claim 14, wherein the EMR shield is attached to the optoelectronic module via one or more alignment pins.

17. The active cable as recited in claim 14, wherein the communications cable includes either twelve optical fibers or twenty-four optical fibers.

18. The active cable as recited in claim 14, wherein each optoelectronic module is substantially compliant with the QSFP MSA or the CXP MSA.

19. The active cable as recited in claim 14, wherein:

the plurality of fingers extend from the at least one edge of the first body;

the plurality of fingers bias against the top shell or the bottom shell in a first direction;

the plurality of leaf springs extend from the at least one edge of the second body; and the plurality of leaf springs bias against the alignment guide in a second direction that is perpendicular to the first direction.

* * * * *